(12) United States Patent
Wang et al.

(10) Patent No.: US 9,502,285 B1
(45) Date of Patent: Nov. 22, 2016

(54) METHOD OF FORMING TRENCHES

(71) Applicant: UNITED MICROELECTRONICS CORP., Hsin-Chu (TW)

(72) Inventors: Harn-Jiunn Wang, Kaohsiung (TW); Chin-Lung Lin, Hsinchu (TW); Yi-Hsiu Lee, Chiayi County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/733,930

(22) Filed: Jun. 8, 2015

(51) Int. Cl.
   *H01L 21/768* (2006.01)

(52) U.S. Cl.
   CPC ... *H01L 21/76816* (2013.01); *H01L 21/76879* (2013.01)

(58) Field of Classification Search
   CPC .................. H01L 21/76802; H01L 21/76816; H01L 21/76877; H01L 21/76879; H01L 21/0332; H01L 21/0337
   See application file for complete search history.

(56) References Cited

U.S. PATENT DOCUMENTS

| | | | |
|---|---|---|---|
| 7,790,360 B2 * | 9/2010 | Alapati | H01L 21/0337 430/316 |
| 8,828,885 B2 | 9/2014 | Lee | |
| 8,951,918 B2 | 2/2015 | Li | |
| 2012/0142194 A1 * | 6/2012 | Hwang | H01L 21/0337 438/703 |
| 2014/0083972 A1 | 3/2014 | Oyama | |
| 2014/0193974 A1 | 7/2014 | Lee | |
| 2014/0220493 A1 | 8/2014 | Shieh | |
| 2015/0040077 A1 | 2/2015 | Ho | |
| 2015/0047891 A1 | 2/2015 | Lee | |

* cited by examiner

*Primary Examiner* — Kyoung Lee
(74) *Attorney, Agent, or Firm* — Winston Hsu; Scott Margo

(57) ABSTRACT

A method of forming trenches is provided. A first layer, a second layer and a third layer are formed on the substrate. A patterned third layer with a plurality of third trenches is formed. A spacer is formed on sidewalls of the third trenches, following by removing a portion of the patterned third layer between the third trenches. By using the spacer and the patterned third layer as a mask, a patterned second layer with a plurality of second trenches is formed. Next, the patterned third layer and the spacer are completely removed, and a block layer is formed on the patterned second layer, filling into the at least one second trench to separate said second trench into at least two parts. The first layer is patterned by using the patterned second layer and the block layer as a mask to form a patterned first layer with first trenches.

30 Claims, 9 Drawing Sheets

METHOD OF FORMING TRENCHES

BACKGROUND OF THE INVENTION

1. Field of the Invention

The present invention therefore provides a method of forming trenches, and more particularly, to a method of forming trenches which can have desired contour and desired shape.

2. Description of the Prior Art

In semiconductor manufacturing processes, in order to transfer an integrated circuit layout onto a semiconductor wafer, the integrated circuit layout is first designed and formed as a photo-mask pattern. The photo-mask pattern is then proportionally transferred to a photoresist layer positioned on the semiconductor wafer.

In recent years, with the increasing miniaturization of semiconductor devices, the design rule of line width and space between lines or devices becomes finer, for example down to feature sizes of 65 nanometers (nm), 45 nm and even to 32 nm. The width is subject to optical characteristics, however. To obtain fine-sized devices in the exposure, the interval between transparent regions in a mask is scaled down with device size. When the light passes through the mask, diffraction occurs and reduces resolution. Moreover, when light passes through the transparent regions of a mask having different interval sizes, the light through the regions having small interval sizes is influenced by the transparent regions having large interval sizes, resulting in deformation of the transfer pattern. For example, right-angled corner rounded phenomenon, line end shortened phenomenon, and line width increase/decrease phenomenon are well known defects resulting from OPE.

A double-exposure technique has been developed in recent years, which involves forming a target pattern by two exposure processes; however, the double-exposure technique still has some problems that need to be overcome. For example, when two features have their lengthwise directions aligned to a same straight line, and the line ends of the features face each other, it is difficult to control the uniformity of the line end space due to the proximity effect and overlay variation. The line widths of the features are also difficult to control, especially when there are other features close to these two features.

SUMMARY OF THE INVENTION

The present invention therefore provides a method of forming trenches, wherein the formed trenches can have sharp contour and desired shape.

According to one embodiment of the claimed invention, a method of forming trenches is provided. First, a first layer, a second layer and a third layer are formed on the substrate. A plurality of third trenches are formed in the third layer, thereby forming a patterned third layer. A spacer is formed on sidewalls of the third trenches, following by removing a portion of the patterned third layer between the third trenches. By using the spacer and the patterned third layer as a mask to pattern the second layer, a patterned second layer with a plurality of second trenches is formed, wherein the second trenches expose the first layer. Next, the patterned third layer and the spacer are completely removed, and a block layer is formed on the patterned second layer, filling into the at least one second trench to separate said second trench into at least two parts. Lastly, the first layer is patterned by using the patterned second layer and the block layer as a mask to form a patterned first layer with a plurality of first trenches.

The method of forming trenches set forth in the present invention provides a novel way to form trenches with desired contour. Since each target trenches are formed by a trench pattern (second trench) being "cut" by the sub block, the contour of the target trench can be sharp. In addition, by controlling the parameters of the trenches in the beginning, the formed target trenches can have desired widths and lengths.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1A:
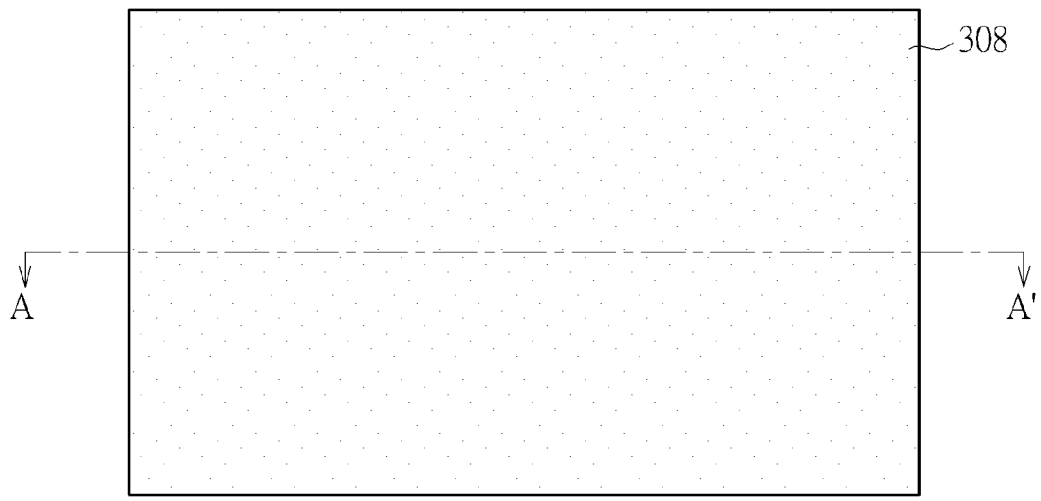
FIG. 1A, FIG. 1B, FIG. 2A, FIG. 2B, FIG. 3A, FIG. 3B, FIG. 4A, FIG. 4B, FIG. 5A, FIG. 5B, FIG. 6A, FIG. 6B FIG. 7A, FIG. 7B, FIG. 8A, FIG. 8B, FIG. 9A and FIG. 9B illustrate schematic diagrams of the method of forming trenches according to the one embodiment of the present invention.
Figure 1B:
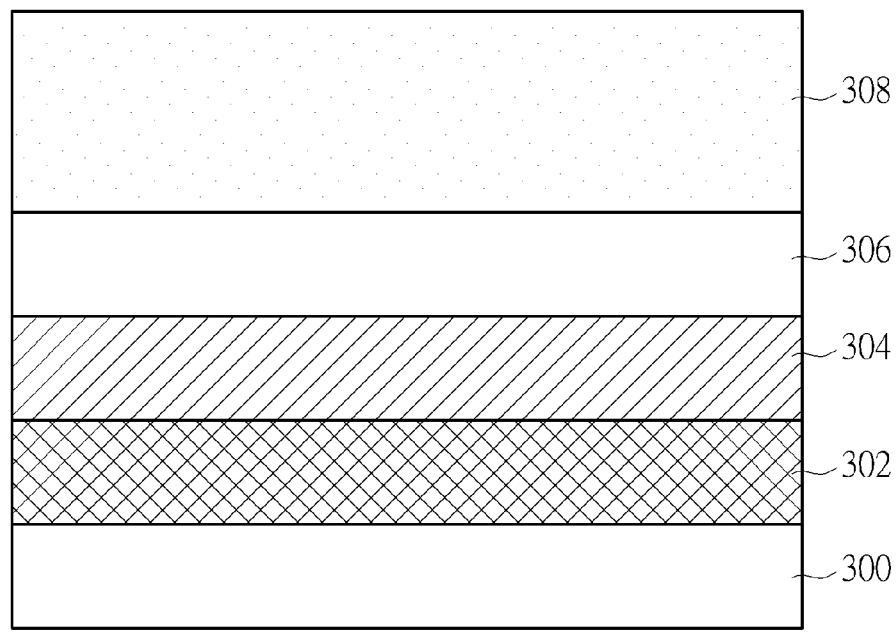
Figure 2A:
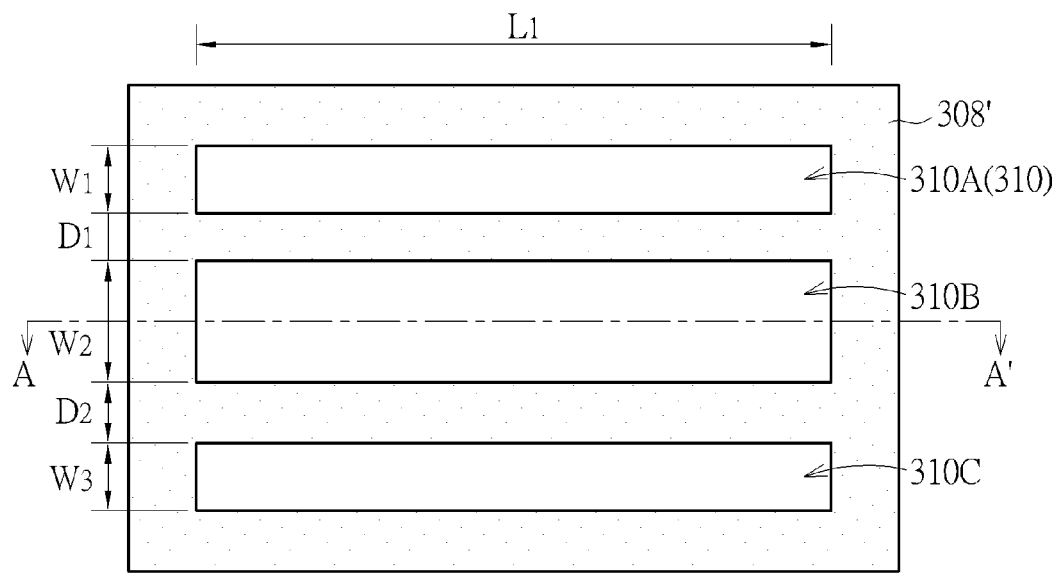
Figure 2B:
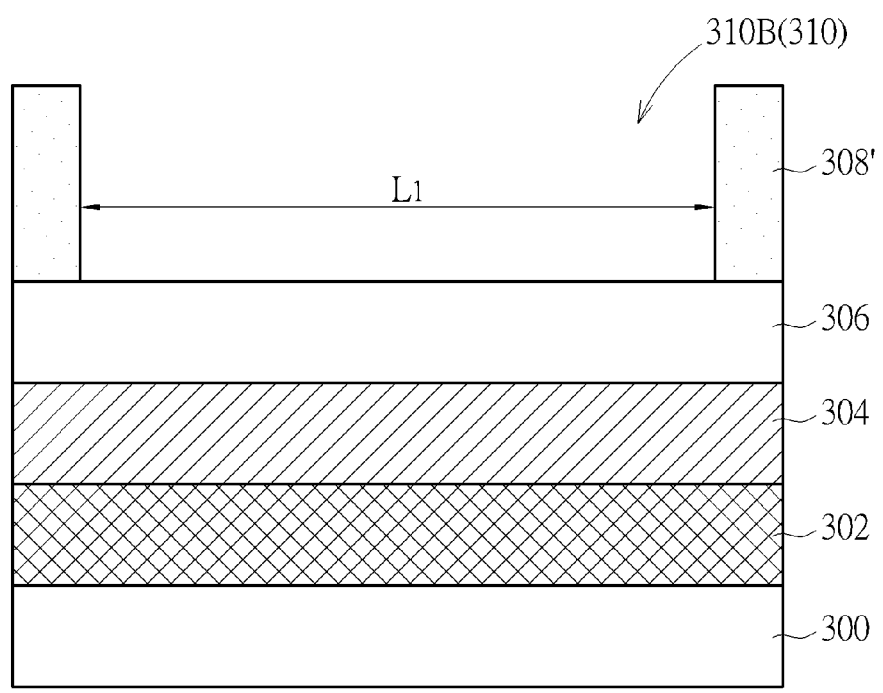
Figure 3A:
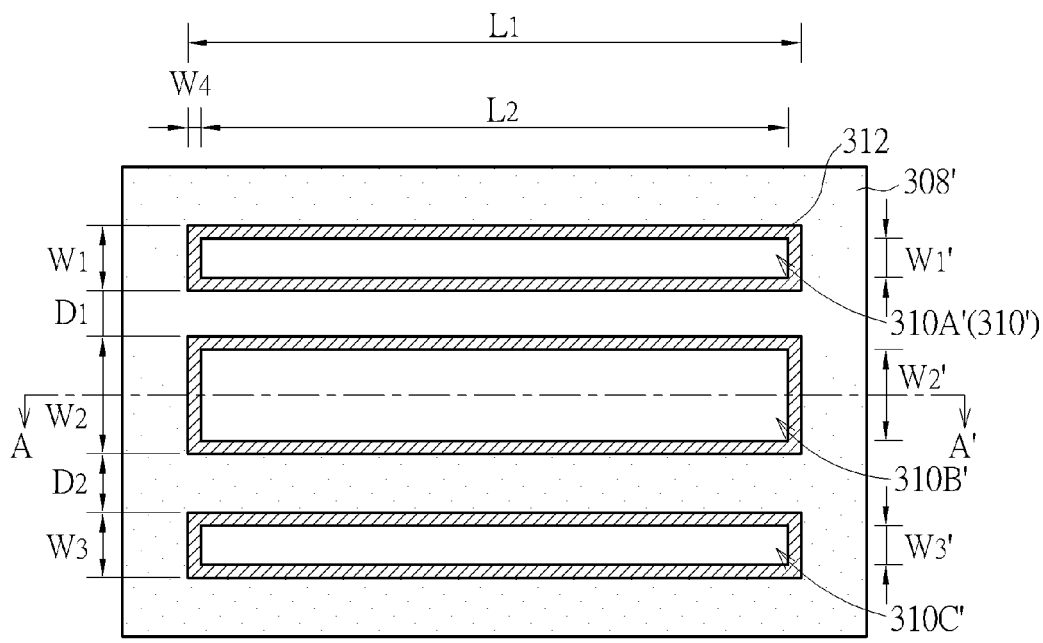
Figure 3B:
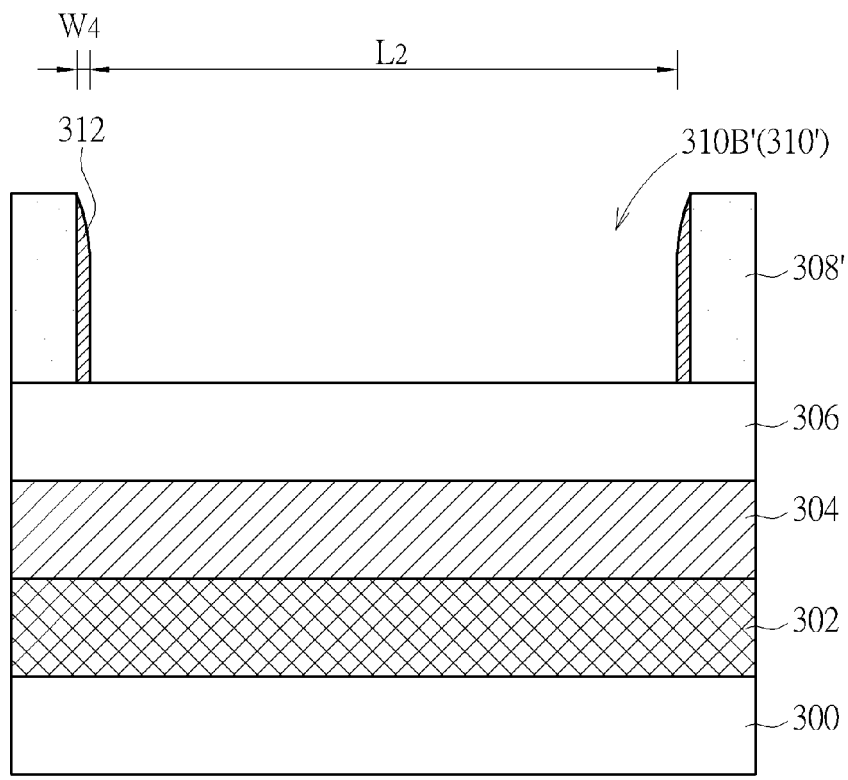

Please refer to FIG. 1A, FIG. 1B, FIG. 2A, FIG. 2B, FIG. 3A, FIG. 3B, FIG. 4A, FIG. 4B, FIG. 5A, FIG. 5B, FIG. 6A, FIG. 6B, FIG. 7A, FIG. 7B, FIG. 8A, FIG. 8B, FIG. 9A and FIG. 9B, illustrating schematic diagrams of the method of forming trenches according to one embodiment of the present invention, in which FIG. 1A, FIG. 2A, 3A, FIG. 4A, FIG. 5A, FIG. 6A, FIG. 7A, FIG. 8A and FIG. 9A are top views and FIG. 1B, FIG. 2B and FIG. 3B are cross-sectional views taken along line AA' in FIG. 1A, FIG. 2A and FIG. 3A, and FIG. 4B, FIG. 5B and FIG. 6B, FIG. 7B, FIG. 8B and FIG. 9B are cross-sectional views taken along line BB' in FIG. 4A, FIG. 5A and FIG. 6A, FIG. 7A, FIG. 8A and FIG. 9A, respectively.

Please see FIG. 1A and FIG. 1B. A semiconductor substrate 300 is provided to serve as a base for forming devices, components, or circuits. In one embodiment, the substrate 300 includes a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layered materials thereof. The substrate 300 may also be composed of other semiconductor materials, such as germanium, and compound semiconductor substrates, such as type III/V semiconductor substrates, e.g., GaAs. Although the semiconductor substrate 300 is depicted as a bulk semiconductor substrate, the arrangement of a semiconductor on an insulator substrate, such as silicon-on-insulator (SOI) substrates. In another embodiment, the substrate 300 can include a non-semiconductor substrate, such as a glass substrate for a thin-film-transistor display device formed thereon, or a fused quartz for a photo mask formed thereon. In another embodiment, the substrate 300 can include a plurality of doping regions, one or a plurality of dielectric layers or a metal interconnect system in which one or a plurality of microelectronic components are disposed therein, such as a complementary metal oxide semiconductor (CMOS) or a photo-diode. Next, a target layer 302, a first layer 304, a second layer 306 and a third layer 308 are sequentially formed on the substrate 300. In the subsequent steps, a target pattern (now shown in FIG. 1A and FIG. 1B) will be formed in the target layer 302. In one embodiment, the target layer 302 comprises a low-k dielectric material, such as $SiO_2$, Tetraethyl orthosilicate (TEOS) or plasma enhanced tetraethyl orthosilicate (PETEOS), but is not limited thereto. Preferably, the target layer 302 comprises silicon oxide, which can server as an inter-metal dielectric (IMD) layer. The materials of the first layer 304, the second layer 306 and the third layer 308 can be any material suitable for being a mask. Preferably, the first layer 304 has an etching selectivity with respect to the second layer 306, and the second layer 306 has an etching selectivity with respect to the third layer 308. In one embodiment, the first layer 304 includes TiN or TaN, the second layer 306 includes silicon oxide, and the third layer 308 includes amorphous silicon.

As shown in FIG. 2A and FIG. 2B, the third layer 308 is patterned to form a patterned third layer 308' with a plurality of third trenches 310, each exposes the second layer 306. The layout of the third trenches 310 can be arranged arbitrarily, depending on the design of the product. In one embodiment, the third trenches 310 are arranged in an array and a regular shape and/or distances therebetween are provided. Preferably, the third trenches 310 have rectangle shape and are parallel to each other, stretching along the same direction. The third trenches 310 can have the same or different lengths and/or widths. In one embodiment, as shown in FIG. 2A, the third trenches 310A, 310B, 310C have the same length $L_1$ but different widths $W_1$, $W_2$, $W_3$, respectively. The shorter edges of each third trench 310 are aligned with each other. A distance $D_1$ is disposed between the third trench 310A and the third trench 310B, and a distance $D_2$ is disposed between the third trench 310B and the third trench 310C. The value of the length $L_1$, widths $W_1$, $W_2$, $W_3$ and distances $D_1$, $D_2$ are predetermined value that would affect the final pattern in the target layer 302. Detail description will be shown in the following context.

Next, as shown in FIG. 3A and FIG. 3B, a spacer 312 with a width $W_4$ is formed on sidewalls of the third trenches 310. The method of forming the spacer 312, for example, includes forming a spacer material layer (not shown) conformally on the patterned third layer 308'. An anisotropic etching process is performed to form said spacer 312 with predetermined width $W_4$. The material of the spacer 312 has an etching selectivity with respect to the third layer 308, the second layer 306 and the first layer 304. In one embodiment, the spacer 312 includes silicon nitride (SiN). After forming the spacer 312, the space of each third trenches 310 shrinks inwardly to become a narrowed third trench 310'. The narrowed third trenches 310A', 310B', 310C' therefore have a reduced length $L_2$, and reduced widths $W_1'$, $W_2'$, $W_3'$. In detail, $L_2$ equals to $(L_1-2*W_4)$, and $W_1'$ equals to $(W_1-2*W_4)$, $W_2'$ equals to $(W_2-2*W_4)$, $W_3'$ equals to $(W_3-2*W_4)$, respectively.

Figure 4A:
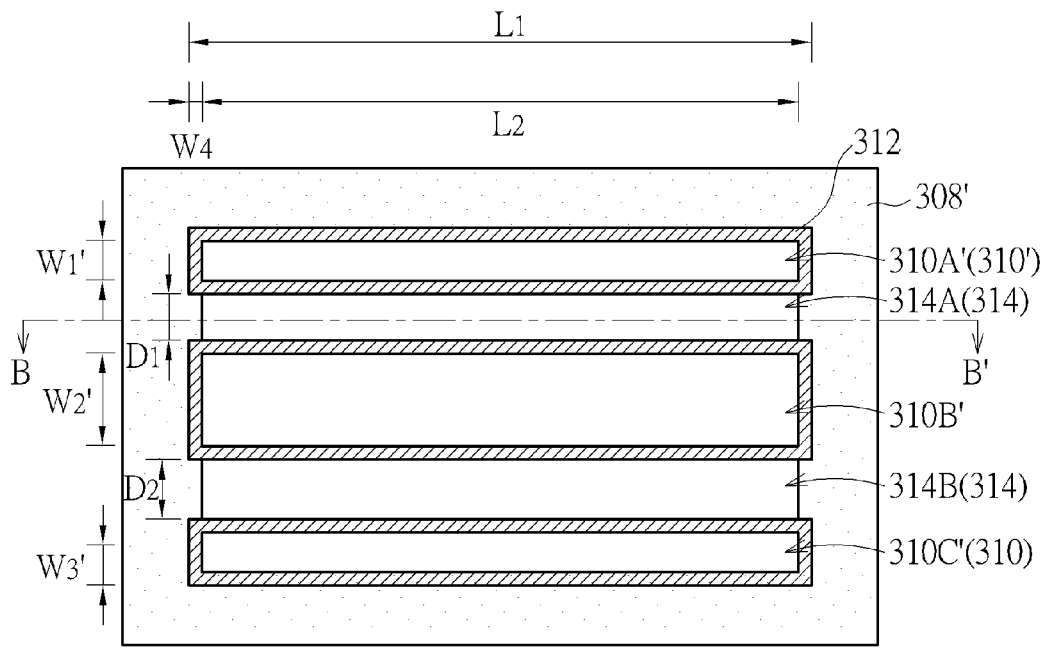
Figure 4B:
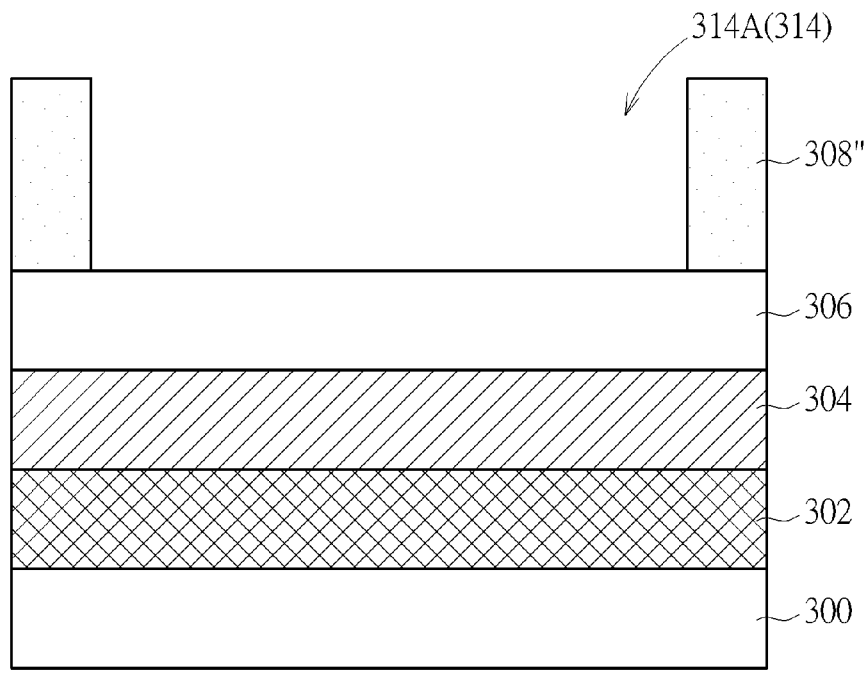

As shown in FIG. 4A and FIG. 4B, the patterned third layer 308' is patterned again to remove the portions between each third trenches 310, thereby forming a patterned third layer 308" with newly formed fourth trenches 314 and the narrowed third trenches 310'. In preferred embodiment, the shorter edges of the fourth trench 314 are aligned with those of the narrowed third trenches 310'. Thus, the fourth trenches 314 have the same length as those of the narrowed third trench 310', which is $L_2$. The fourth trench 314A has a width the same as the distance $D_1$, and the fourth trench 314B has a width the same as the distance $D_2$.

Figure 5A:
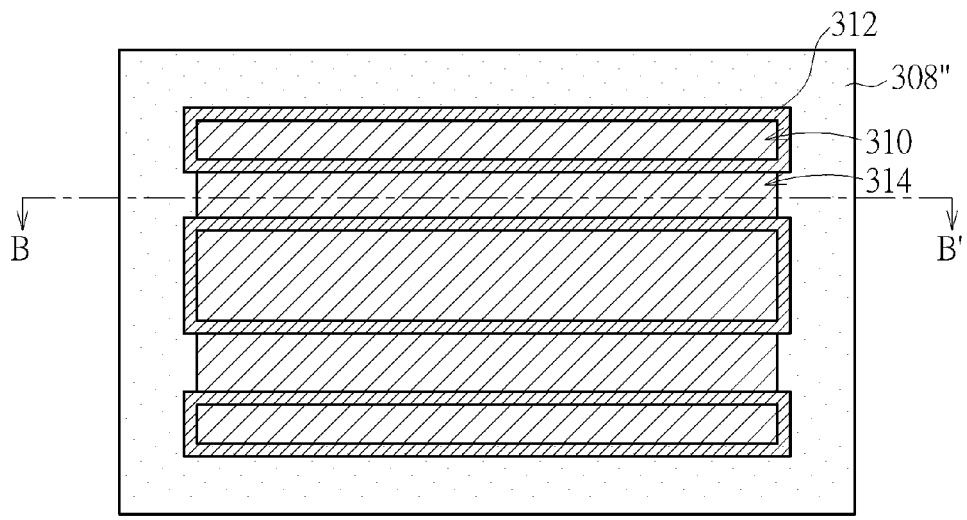
Figure 5B:
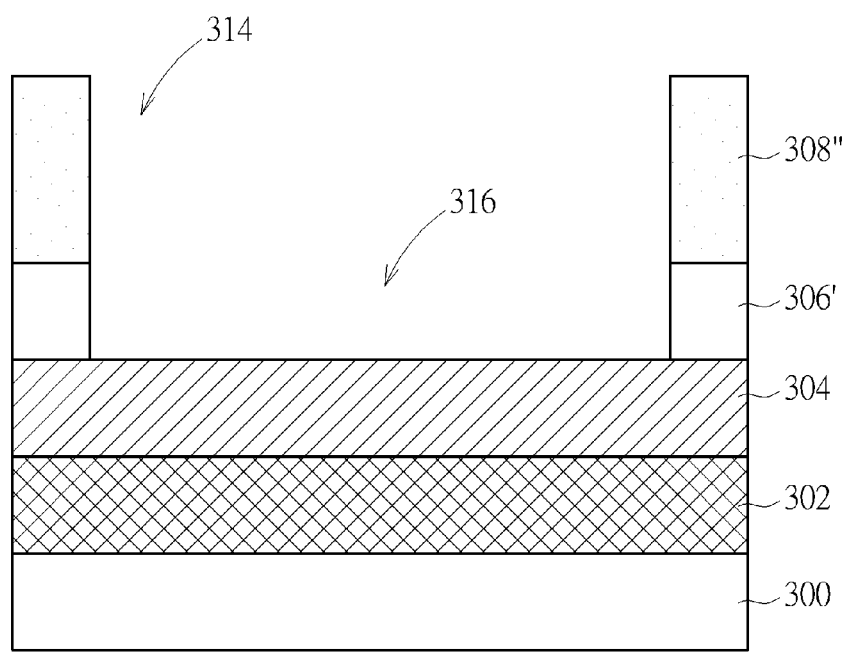

Next, as shown in FIG. 5A and FIG. 5B, by using the patterned third layer 308" and the spacer 312 as a mask, the exposed second layer 306 is removed to form a patterned second layer 306', thereby exposing the first layer 304. The patterned second layer 306' includes a plurality of second trenches 316, which correspond to the narrowed third trenches 310' and the fourth trenches 314. Detail descriptions of the contour of each second trench 316 can refer to the above context and are omitted for the sake of simplicity.

Figure 6A:
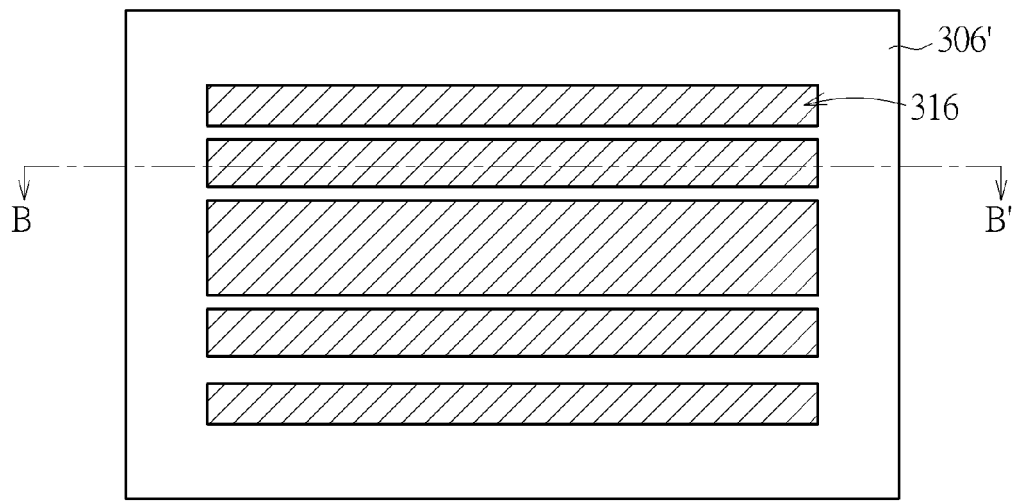
Figure 6B:
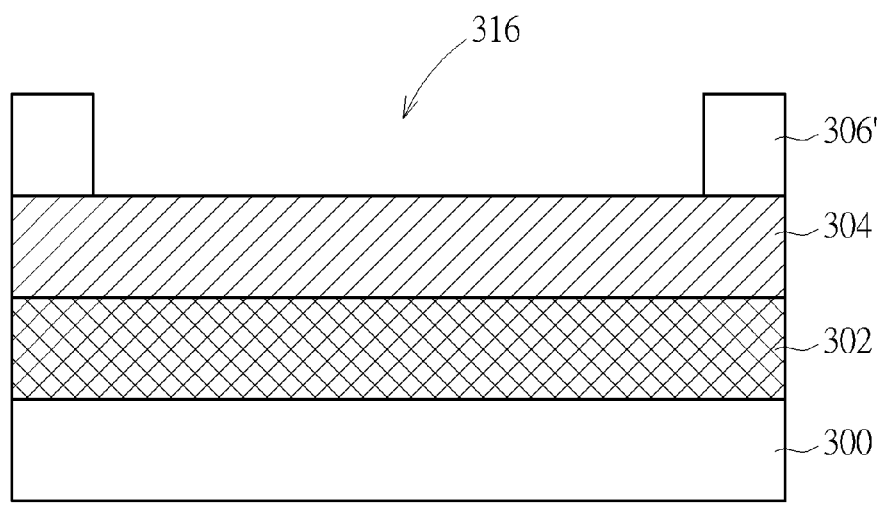

After forming the second trenches 316, as shown in FIG. 6A and FIG. 6B, the spacer 312 and the patterned third layer 308" are completely removed away. The spacer 312 and the patterned third layer 308" can be removed in one single etching process or can be removed separately.

Figure 7A:
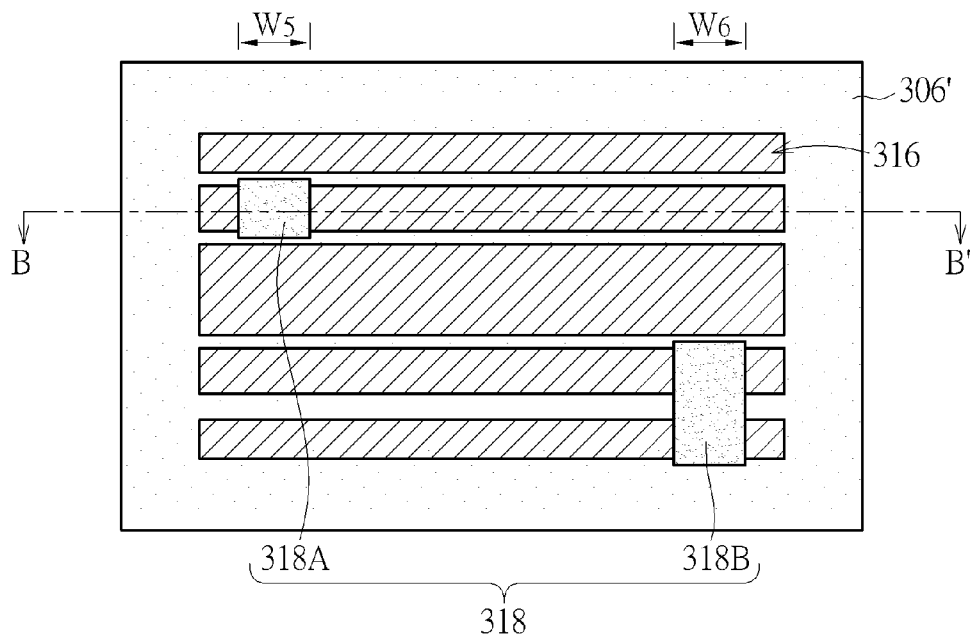
Figure 7B:
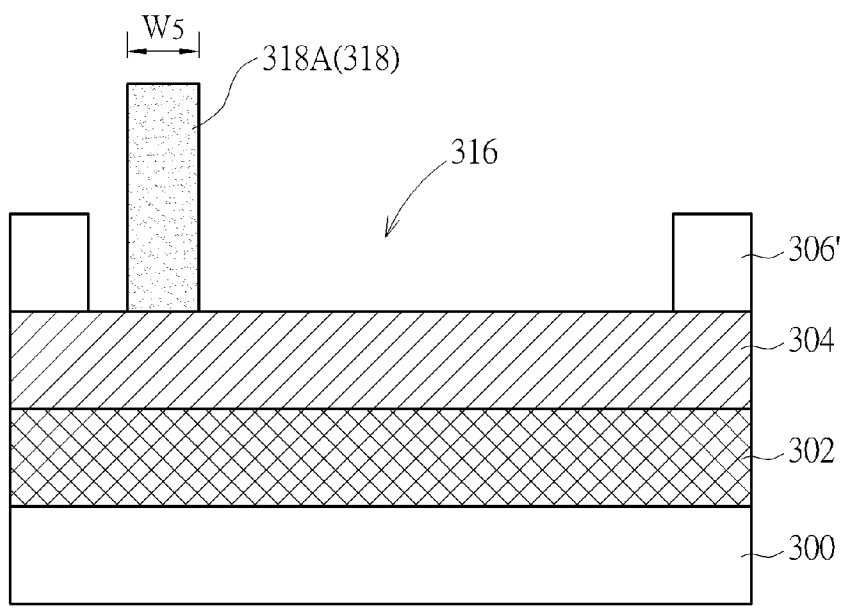

Subsequently, as shown in FIG. 7A and FIG. 7B, a block layer 318 is formed on the patterned second layer 306', to fill into parts of the second trenches 316. In one embodiment, the block layer 318 includes a plurality of sub blocks, such as sub blocks 318A, 318B, which may fill into different second trenches 316. For instance, the sub block 318A is filled into one second trench 316 to separate it into two parts, while the sub block 318B is filled into two second trenches 316 separate each second trench 316 into two parts. Depending on different design, the second trench 316 can be separated into more than two parts by filling into more than one sub blocks. However, there can be second trench 316 not filled by the sub blocks. The material of the block layer 318 and the second layer 306 has an etching selectivity with respect to the first layer 304. The block layer 318 can be made of any mask material and/or photoresist material. In one embodiment, the block layer 318 comprises silicon nitride (SiN), silicon carbide (SiC), silicon oxynitride (SiON), metal or advanced pattern film (APF) provided by Applied Material. In another embodiment, the block layer 318 is composed of a multi-layered photoresist layer, including a bottom photoresist layer (not shown), an anti-reflective layer (not shown) and a top photoresist layer (not shown). Precisely speaking, the bottom photoresist layer/the anti-reflective layer/the top photoresist layer may be an ODL/a SHB layer/a 193 nm PR, wherein ODL is an abbreviation of organic dielectric layer, SHB is an abbreviation of silicon-containing hard-mask bottom anti-reflection coating, and 193 nm PR is a specific kind of photoresist that can be decomposed by a light source with a wavelength of 193 nanometers. The fabrication process for the bottom photoresist layer/the anti-reflective layer/the top photoresist layer may include the following steps. First, a bottom PR layer, like an ODL, is coated on the substrate and a baking procedure may further be performed optionally. Subsequently, an anti-reflective layer, such as an SHB, is formed. The composition of the SHB layer is organosilicon polymers or polysilane, which comprises at least a chromophore group, a crosslinkable group and a cross-linking agent. Finally, the top PR layer, such as 193 nm PR, is coated on the SHB layer. In this case, the top PR layer does not need to be very thick since the top PR layer mainly serves as a dry etch hard mask and the pattern defined therein only needs to be transferred from itself to the underlying SHB layer during the corresponding pattern transfer process. In another case, the composition of the amorphous carbon layer/the anti-reflective layer/the PR layer may respectively be an advanced patterning film (APF)/a SHB layer/a 193 nm PR. It should be noted that since the advanced patterning film (a type of amorphous carbon layer) has a high aspect ratio (HAR), a low line edge roughness (LER) and a PR-like ashability, it is widely used in advanced semiconductor processes.

Figure 8A:
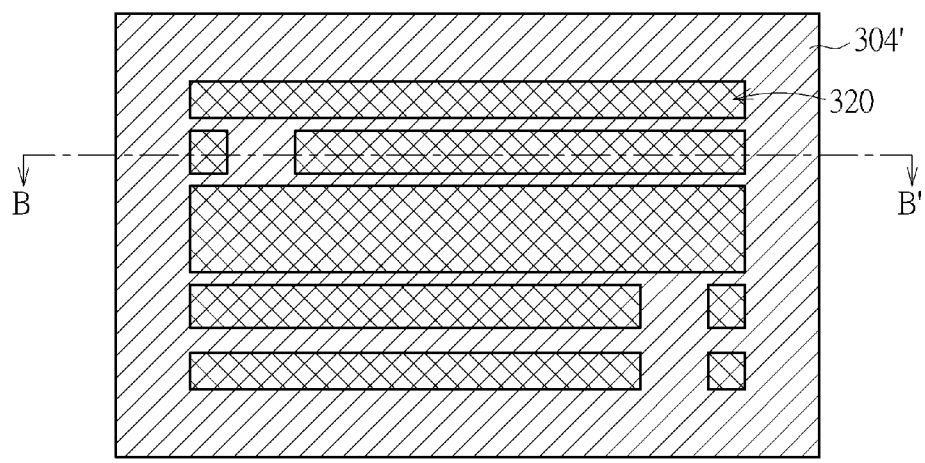
Figure 8B:
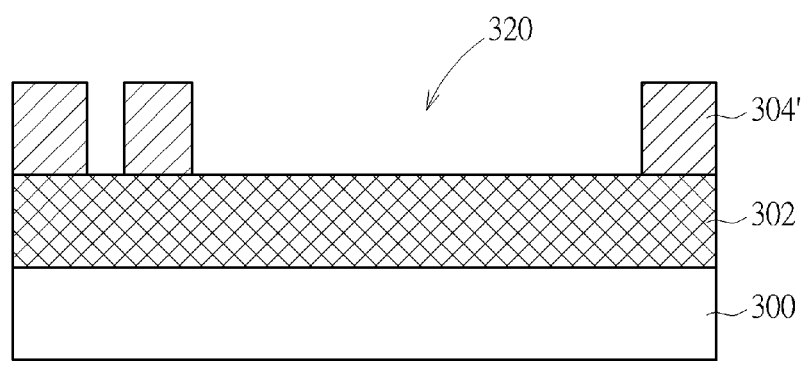

Next, as shown in FIG. 8A and FIG. 8B, an etching process is carried out by using the block layer 318 and the patterned second layer 306' as a mask, thereto form a plurality first trenches 320 in the patterned first layer 304'. Since some portions of the second layer 316 in the patterned second layer 306' are covered by the block layer 318, the covered portion would not transfer to the first layer 304. Therefore, the first trenches 320 would correspond the separated parts of the second trenches 316 and expose the first layer 302. Next, the block layer 318 and the patterned second layer 306 are removed away.

Figure 9A:
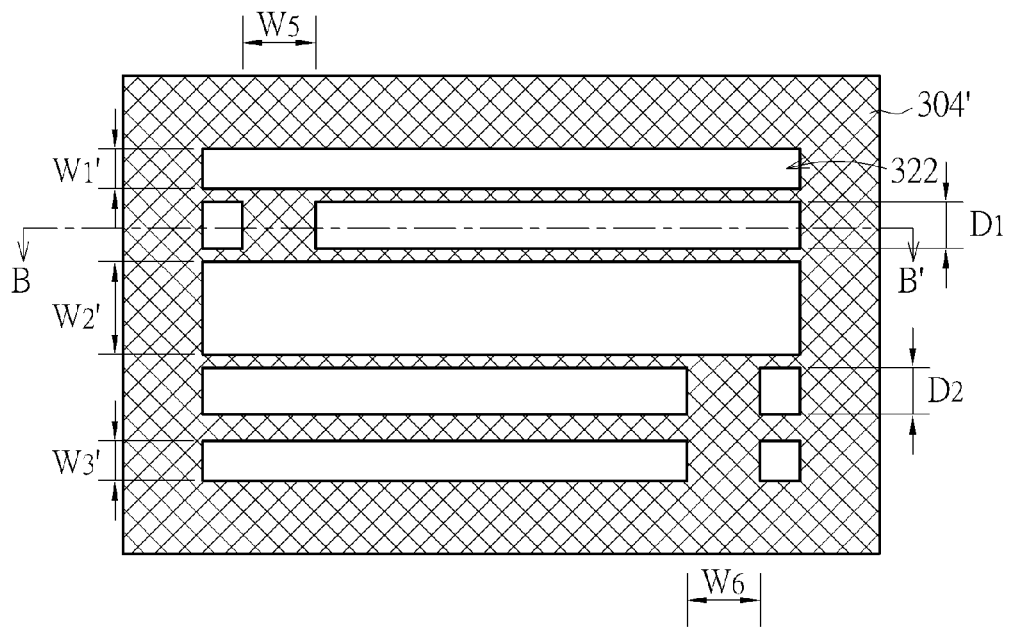
Figure 9B:
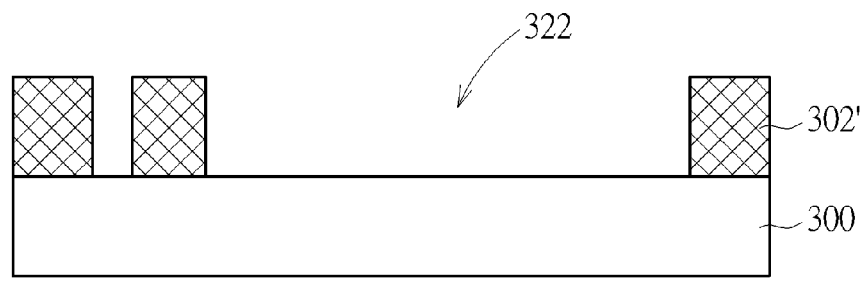

As shown in FIG. 9A and FIG. 9B, another etching process is carried out by using the patterned first layer 304' as a mask to transfer the patterns with first trenches 320 to the target layer 302. A patterned target layer 302' with desired target trenches 322 is therefore formed. The target trenches 322 would have desired widths and lengths corresponding to the width $W_1'$, $D_1$, $W_2'$, $D_2$, $W_3'$, $W_5$, $W_6$ and $L_2$, which are related to the narrowed third trenches 310', the fourth trench 314 and the block layer 318, respectively. In one embodiment, the widths of all the target trenches 322 are equal, that is, $W_1'=D_1=W_2'=D_2=W_3'$. To meet the requirement, the original parameters of the third trenches 310 should be $W_1=W_2=W_3=D_1+2W_4=D_2+2W_4$. However, in another embodiment, they can be different. Subsequently, the patterned target layer 302' can be subjected to any semiconductor processes for forming various components. In one preferred embodiment, the target trenches 302 can be used as trench portions or via portions of dual damascene structure and can be filled into a conductive material to form a part of the metal interconnection system. In another embodiment, the target trenches 302 can be filled into insulation material to form insulation structures such as shallow trench isolations (STI) or capacitors and so on.

In another embodiment, the patterned first layer 304' with first trenches 320 can also server as the final structure with desired patterns. Similarly, the patterned first layer 304' can be subjected to any semiconductor processes for forming various components. For example, the first trenches 320 can be filled into conductive material to form a part of the metal interconnection system or can be filled into insulation material to form STIs. In this embodiment, the target layer 302 can be omitted.

In summary, the method of forming trenches set forth in the present invention provides a novel way to form trenches with desired contour. Since each target trenches are formed by a trench pattern (second trench) being "cut" by the sub block, the contour of the target trench can be sharp. In addition, by controlling the parameters of the trenches in the beginning, the formed target trenches can have desired widths and lengths.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming trenches, comprising:
    forming a first layer, a second layer and a third layer on the substrate, wherein the first layer comprises TiN or TaN;
    forming a plurality of third trenches in the third layer, thereby forming a patterned third layer;
    forming a spacer on sidewalls of the third trenches;
    removing a portion of the patterned third layer between the third trenches;
    using the spacer and the patterned third layer as a mask to pattern the second layer, thereby forming a patterned second layer with a plurality of second trenches which expose the first layer;
    completely removing the patterned third layer and the spacer;
    forming a block layer on the patterned second layer, filling into the at least one second trench to separate said second trench into at least two parts; and
    patterning the first layer by using the patterned second layer and the block layer as a mask to form a patterned first layer with a plurality of first trenches.

2. The method of forming trenches according to claim 1, further comprising:
    forming a target layer between the first layer and the substrate.

3. The method of forming trenches according to claim 2, after forming the patterned first layer, further comprising:
    completely removing the patterned second layer and the block layer; and
    patterning the target layer by using the patterned first layer as a mask to form a plurality of target trenches.

4. The method of forming trenches according to claim 3, further comprising filling a conductive layer into the target trenches to form a part of a metal interconnection system.

5. The method of forming trenches according to claim 1, wherein the block layer has a plurality of sub blocks.

6. The method of forming trenches according to claim 5, wherein the sub block has an island shape.

7. The method of forming trenches according to claim 5, wherein one sub block is filled into one second trench to separate said second trench into two parts.

8. The method of forming trenches according to claim 5, wherein one sub block is filled into two second trenches to separate said second trench into two parts respectively.

9. The method of forming trenches according to claim 5, wherein a plurality of sub blocks are filled into one second trenches to separate said second trench into a plurality of parts.

10. The method of forming trenches according to claim 1, wherein the third trenches are parallel to each other.

11. The method of forming trenches according to claim 1, wherein after removing the portion of the patterned third layer between the third trenches, a plurality of fourth trenches are formed in the patterned third layer.

12. The method of forming trenches according to claim 11, wherein a set of short edge of each fourth trench is aligned with that of each third trench.

13. The method of forming trenches according to claim 1, wherein the first layer has an etching selectivity with respect to the second layer.

14. The method of forming trenches according to claim 1, wherein the third layer comprises amorphous silicon.

15. The method of forming trenches according to claim 1, wherein the second layer and the block layer has an etching selectivity with respect to the first layer.

16. The method of forming trenches according to claim 1, wherein the second layer comprises silicon oxide.

17. The method of forming trenches according to claim 2, wherein the third layer has an etching selectivity with respect to the target layer.

18. The method of forming trenches according to claim 2, wherein the target layer comprises a low-k dielectric material.

19. The method of forming trenches according to claim 1, wherein the second layer and the block layer has an etching selectivity with respect to the first layer.

20. A method of forming trenches, comprising:
forming a first layer, a second layer and a third layer on the substrate;
forming a plurality of third trenches in the third layer, thereby forming a patterned third layer;
forming a spacer on sidewalls of the third trenches;
removing a portion of the patterned third layer between the third trenches;
using the spacer and the patterned third layer as a mask to pattern the second layer, thereby forming a patterned second layer with a plurality of second trenches which expose the first layer;
completely removing the patterned third layer and the spacer;
forming a block layer on the patterned second layer, filling into the at least one second trench to separate said second trench into at least two parts;
patterning the first layer by using the patterned second layer and the block layer as a mask to form a patterned first layer with a plurality of first trenches; and
filling a conductive layer into the first trenches to form a part of a metal interconnection system.

21. The method of forming trenches according to claim 20, wherein the block layer has a plurality of sub blocks.

22. The method of forming trenches according to claim 21, wherein the sub block has an island shape.

23. The method of forming trenches according to claim 21, wherein one sub block is filled into one second trench to separate said second trench into two parts.

24. The method of forming trenches according to claim 21, wherein one sub block is filled into two second trenches to separate said second trench into two parts respectively.

25. The method of forming trenches according to claim 21, wherein a plurality of sub blocks are filled into one second trenches to separate said second trench into a plurality of parts.

26. The method of forming trenches according to claim 20, wherein the third trenches are parallel to each other.

27. The method of forming trenches according to claim 20, wherein after removing the portion of the patterned third layer between the third trenches, a plurality of fourth trenches are formed in the patterned third layer.

28. The method of forming trenches according to claim 27, wherein a set of short edge of each fourth trench is aligned with that of each third trench.

29. The method of forming trenches according to claim 20, wherein the first layer has an etching selectivity with respect to the second layer.

30. The method of forming trenches according to claim 20, wherein the third layer comprises amorphous silicon.

* * * * *